United States Patent
Heyne et al.

(10) Patent No.: US 12,151,577 B2
(45) Date of Patent: Nov. 26, 2024

(54) METHOD FOR OPERATING A VEHICLE-EXTERNAL CHARGING DEVICE FOR CHARGING A VEHICLE AND CHARGING DEVICE

(71) Applicant: Dr. Ing. h.c. F. Porsche Aktiengesellschaft, Stuttgart (DE)

(72) Inventors: Raoul Heyne, Wiernsheim (DE); Marija Jankovic, Stuttgart (DE)

(73) Assignee: Dr. Ing. h. c. F. Porsche AG, Stuttgart (DE)

( * ) Notice: Subject to any disclaimer, the term of this patent is extended or adjusted under 35 U.S.C. 154(b) by 496 days.

(21) Appl. No.: 17/494,178

(22) Filed: Oct. 5, 2021

(65) Prior Publication Data

US 2022/0105822 A1 Apr. 7, 2022

(30) Foreign Application Priority Data

Oct. 5, 2020 (DE) ...................... 10 2020 125 943.3

(51) Int. Cl.
| | |
|---|---|
| *B60L 53/62* | (2019.01) |
| *B60L 53/18* | (2019.01) |
| *G01R 19/00* | (2006.01) |
| *G01R 31/12* | (2020.01) |
| *G01R 31/67* | (2020.01) |
| *H02J 7/00* | (2006.01) |

(52) U.S. Cl.
CPC ............... *B60L 53/62* (2019.02); *B60L 53/18* (2019.02); *G01R 19/0084* (2013.01); *G01R 31/1272* (2013.01); *G01R 31/67* (2020.01); *H02J 7/0045* (2013.01); *H02J 7/0047* (2013.01)

(58) Field of Classification Search
CPC ......... B60L 53/62; B60L 53/18; G01R 31/67; G01R 31/1272; G01R 19/0084; H02J 7/0045; H02J 7/0047
USPC ........................................................ 320/109
See application file for complete search history.

(56) References Cited

U.S. PATENT DOCUMENTS

| | | | |
|---|---|---|---|
| 10,605,886 B2 | 3/2020 | Hackl | |
| 10,753,984 B2 | 8/2020 | Schaefer et al. | |
| 10,809,306 B2 * | 10/2020 | Roettinger | ........... G01R 31/392 |

(Continued)

FOREIGN PATENT DOCUMENTS

| | | |
|---|---|---|
| DE | 102009034887 | 2/2011 |
| DE | 10 2016 207 197 | 7/2017 |

(Continued)

OTHER PUBLICATIONS

European Search Report dated Jan. 7, 2022.
German Examination Report of Jun. 25, 2021.

*Primary Examiner* — Nathaniel R Pelton
(74) *Attorney, Agent, or Firm* — Gerald E. Hespos; Michael J Porco

(57) ABSTRACT

A method is provided for operating a vehicle-external charging device (1) for charging an electric or hybrid vehicle. The method checks an electrical connection of an insulation monitor (3) between a contactor (4) of the charging device (1) and a charging cable (5) of the charging device (1) when the contactor (4) is in a closed switching state and also uses the insulation monitor to check an electrical insulation of the charging cable (5) when the contactor (4) is in an open switching state. A charging device (1) also is provided.

7 Claims, 1 Drawing Sheet

(56) References Cited

U.S. PATENT DOCUMENTS

| | | | |
|---|---|---|---|
| 2011/0273139 A1* | 11/2011 | Hofheinz | B60L 53/11 |
| | | | 320/109 |
| 2012/0126839 A1 | 5/2012 | Schaefer et al. | |
| 2012/0249070 A1* | 10/2012 | Sellner | B60L 3/0069 |
| | | | 320/109 |
| 2013/0249485 A1* | 9/2013 | Bohm | B60L 53/50 |
| | | | 320/109 |
| 2013/0278273 A1* | 10/2013 | Barlag | G01R 31/58 |
| | | | 324/537 |
| 2014/0217971 A1 | 8/2014 | Wu | |
| 2017/0317513 A1* | 11/2017 | King | B60L 53/305 |
| 2020/0189415 A1* | 6/2020 | Ono | B60L 3/04 |
| 2020/0254882 A1 | 8/2020 | Kwon et al. | |
| 2022/0250491 A1* | 8/2022 | Fuehrer | B60L 53/16 |

FOREIGN PATENT DOCUMENTS

| | | |
|---|---|---|
| DE | 10 2017 005 306 | 11/2017 |
| DE | 10 2017 209 243 | 12/2018 |
| WO | 2010/136284 | 12/2010 |

* cited by examiner

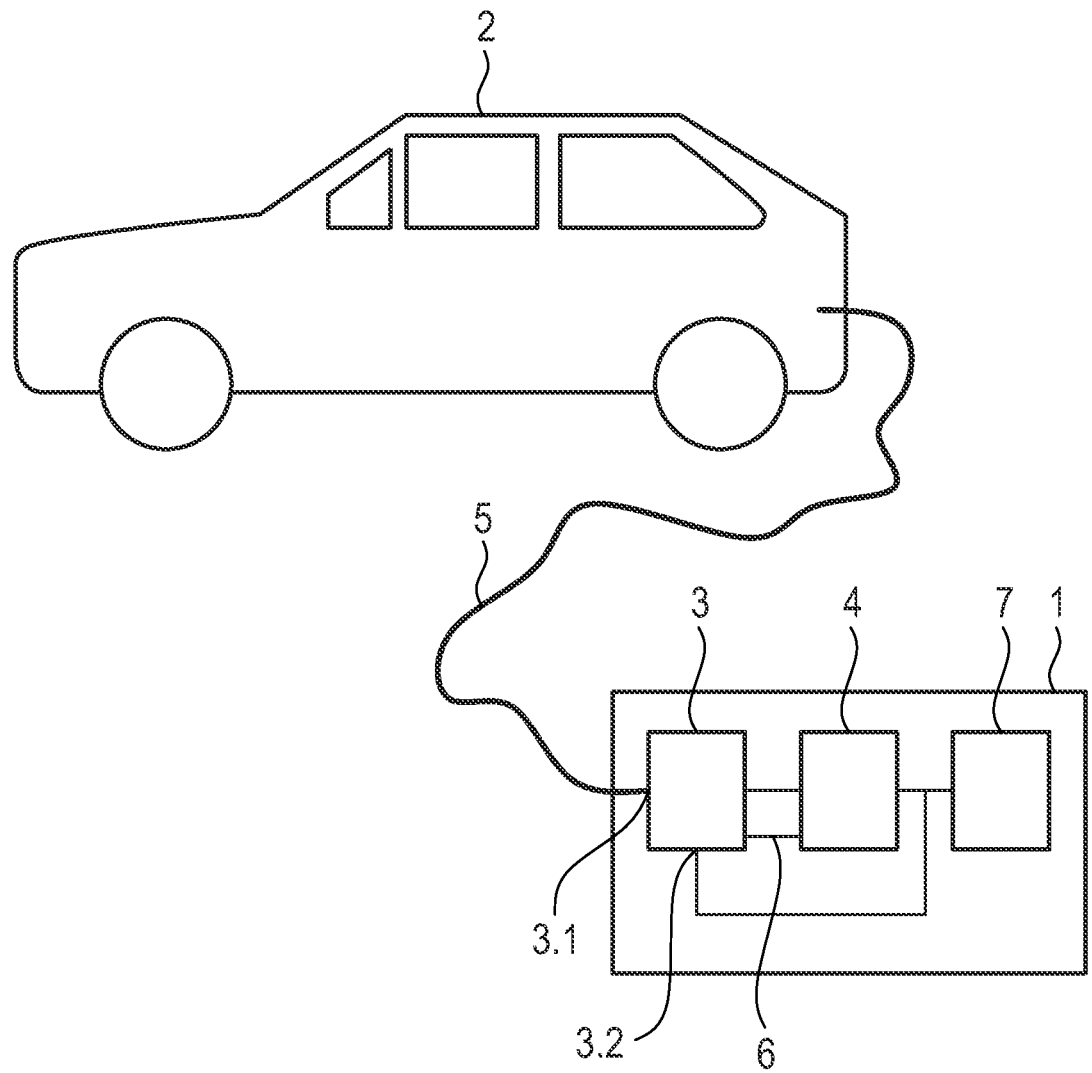

METHOD FOR OPERATING A VEHICLE-EXTERNAL CHARGING DEVICE FOR CHARGING A VEHICLE AND CHARGING DEVICE

CROSS REFERENCE TO RELATED APPLICATION

This application claims priority under 35 USC 119 to German Patent Appl. No. 10 2020 125 943.3 filed on Oct. 5, 2020, the entire disclosure of which is incorporated herein by reference.

BACKGROUND

Field of the Invention

The invention relates to a method for operating a vehicle-external charging device for charging an electric or hybrid vehicle.

Related Art

Safe functioning of a charging device requires checks on the functional capability of the electrical insulation of the charging cable that is used to connect the vehicle that is to be charged to the charging device. This usually takes place using insulation monitors. However, insulation monitors only function safely when they are connected correctly. Insulation monitors that can check the correct connection autonomously are known and function by means of a resistance check between two electrical lines to which they are connected. Insulation monitors usually are connected to a power electronics system of the charging device and measure a maximum resistance of 4 MOhm during the resistance measurement. The checking of the connection cannot be carried out if the resistance is above this maximum.

Monitoring the electrical insulation of the charging cable usually takes place during a charging process and utilizes a contactor arranged between the insulation monitor and the charging cable. The contactor is in a closed switching state only during the charging process and establishes an electrical connection between the power electronics system, the insulation monitor and the charging cable. An insulation monitor that is arranged on the charging-cable side of the contactor only monitors the insulation of the charging cable when the switching state of the contactor is closed. In such a case, the insulation monitor is not able to determine the correct connection thereof since the charging cable is outside of the charging process when no vehicle is connected and has a resistance of significantly higher than 4 MOhm.

It is desirable to monitor the electrical insulation of the charging cable, even if no vehicle is currently being charged. This would have the advantage that a charging device with a damaged charging cable can be taken out of operation and this state can be indicated to a vehicle driver before the vehicle has been connected to the charging cable.

Against this background, it is the object of the invention to provide a method for carrying out a charging process of a vehicle-external charging device for charging a vehicle that enables monitoring the electrical insulation of the charging cable both during a charging process and when charging is not being performed.

SUMMARY

This disclosure relates to a method for operating a vehicle-external charging device for charging a vehicle, such as an electric vehicle or a hybrid vehicle. The charging device has an insulation monitor that is connected between a contactor of the charging device and a charging cable of the charging device. The method includes using the insulation monitor to check the electrical connection of the insulation monitor when the contactor is in a closed switching state and checking insulation of the charging cable when the contactor is in an open switching state. Thus, the method allows monitoring the electrical insulation of the charging cable to be separated from the monitoring of the correct connection of the insulation monitor, and consequently the electrical insulation of the charging cable can be monitored reliably outside of charging processes as well (i.e. when charging is not being performed).

A contactor within the meaning of this disclosure also is known as a switching contactor and is an electrically or electromagnetically actuated switch for high electrical powers. In particular, a contactor within the meaning of this disclosure is a switch for connecting or disconnecting a charging connection between the vehicle and the charging device.

In accordance with one aspect of this disclosure, the correct connection of the insulation monitor is checked by the insulation monitor. The checking of the correct connection of the insulation monitor by the insulation monitor enables a precise and reliable statement about the connection. The correct connection may be checked by a resistance measurement between the electrical conductors to which the insulation monitor is connected. The same connections of the insulation monitor that are used for monitoring the electrical insulation can be used to measure the resistance.

The switching state of the contactor may be transmitted from a positively driven auxiliary contact of the contactor via a signal line to the insulation monitor. This advantageously makes it possible to determine when the correct connection and when the electrical insulation are intended to be checked.

The switching state of the contactor may be transmitted from a control computer of the charging device to the insulation monitor. The control computer usually controls the charging process, that is to say also controls the switching state of the contactor. It is therefore possible to communicate to the insulation monitor when the correct connection is checked and when the electrical insulation is checked.

The insulation monitor also may monitor a voltage between the electrical conductors of the charging cable. If the switching state of the contactor is open, that is to say is not charged, there is no voltage applied between the conductors. If the contactor is closed for a charging process, a voltage can be measured between the conductors. Thus, the insulation monitor can identify when the correct connection and when the electrical insulation can be checked.

The electrical insulation of the charging device between the contactor and a power electronics system may be checked by the insulation monitor in the open switching state of the contactor. The electrical insulation of the charging device between the contactor and the power electronics system is typically the electrical insulation of busbars and/or electrical lines between the power electronics system and the contactor. To this end, the insulation monitor may be connected using first connections to the charging cable and also using second connections to the busbars and/or the electrical lines between the power electronics system and the contactor.

A further electrical connection of the insulation monitor between the contactor and the power electronics system may be checked in the open switching state of the contactor. The correct further electrical connection may be checked by means of a resistance measurement between the electrical conductors and/or busbars to which the insulation monitor is connected by way of the second connections.

The method may include checking the electrical insulation of the charging cable at first connections of the insulation monitor, and checking the electrical insulation of the charging device between the contactor and the power electronics system at second connections of the insulation monitor. In the closed switching state of the contactor, measurement values at the first connections are compared with measurement values at the second connections. It is thus advantageously possible to discover malfunctions during the charging process and to end the charging process in case of emergency. The measurement values are compared to confirm the correct connection in the case of a self-test.

In one embodiment, the insulation monitor that monitors a voltage between electrical lines of the charging cable further monitors voltage between electrical lines between the contactor and the power electronics system. The voltage is used as identification of a charging process or the introduction of a charging process. A self-test can therefore be carried out in the charging process or the introduction of the charging process, since in this case the contactor is closed and the resistance should be lower than 4 MOhm, for example. A resistance value below a limit value, for example 4 MOhm, when the contactor is open indicates damage to the charging cable. Thus, it is possible to monitor the switching state of the contactor by way of the insulation monitor itself, and it is also possible to identify discrepancies during the charging process.

The electrical connection of the insulation monitor to be checked and/or the electrical insulation of the charging cable to be checked may be based on reference values. The reference values may be provided to the insulation monitor as a value matrix, and the reference values may be updated in the event of a charging process.

The invention also relates to a charging device for carrying out the above-described method.

The charging device may have an insulation monitor connected between a contactor and a charging cable of the charging device. The insulation monitor also may be connected between the contactor and a power electronics system.

All of the details, features and advantages disclosed above relate both to the method and to the charging device.

Further details and advantages of the invention are intended to be explained below with reference to the exemplary embodiment illustrated in the drawing.

BRIEF DESCRIPTION OF THE DRAWINGS

FIG. 1 schematically illustrates a charging device according to an embodiment of the invention that is operated according to the method of the invention.

DETAILED DESCRIPTION

FIG. 1 schematically illustrates a charging device 1 according to an embodiment of the invention. The charging device is operated according to the method of the invention. The charging device 1 is a vehicle-external charging device 1 for charging a vehicle 2 having an electric drive. The vehicle 2 is connected to the charging device 1 using a charging cable 5. A contactor 4 is arranged between a power electronics system 7 of the charging device 1 and the charging cable 5. In the closed switching state, the contactor 4 electrically connects the power electronics system 7 to the charging cable 5 and, in the open switching state, the contactor 4 interrupts the connection between the charging cable 5 and the power electronics system 7.

The charging device 1 has an insulation monitor 3 arranged between the contactor 4 and the charging cable 5. The insulation monitor 3 monitors the electrical insulation of lines to which it is connected and ensures safe charging of the vehicle 2. The insulation monitor 3 checks for a correct connection that will ensure correct functioning of the insulation monitoring system. For this purpose, the insulation monitor carries out a resistance measurement at the electrical lines that are to be monitored. However, this is only possible for resistances that are lower than, for example, 4 MOhm.

It also is desirable for the insulation of the charging cable 5 to be checked when no vehicle 2 is being charged, that is to say when the charging cable 5 has an open end and thus an infinitely high resistance. In such a case, the correct connection of the insulation monitor 3 cannot be checked. However, in accordance with the invention, the connection is checked depending on the switching state of the contactor 4. If the switching state of the contactor 4 is closed, that is to say a charging process is currently taking place, the resistance of the charging cable is below, for example, 4 MOhm, and the correct electrical connection can be checked. If this is determined, the electrical insulation of the charging cable 5 can also be monitored between the charging processes as well.

Information about the switching state of the contactor 4 are obtained by the insulation monitor 3 via a signal line 6 that connects a positively driven auxiliary contact of the contactor to the insulation monitor 3. It is possible that a control computer transmits items of information about the switching state to the insulation monitor 3.

In the context of this disclosure, a "control computer" can be understood to include, for example, a processor and/or a storage unit or memory for storing algorithms and program commands. By way of example, the processor and/or the evaluation unit is specifically configured to carry out program commands in such a way that the processor and/or the control computer carries out functions to implement or realize a method as disclosed herein or a step of a method as disclosed herein. The term control computer is used here synonymously with devices known from the prior art and therefore, encompasses one or more general-purpose processors (CPUs) or microprocessors, RISC processors, GPUs and/or DSPs. The control computer has, for example, additional elements such as storage interfaces or communication interfaces. Optionally or additionally, the term "control computer" refers to a device that is capable of executing a provided or included program, preferably with standardized programming language (for example C++, JavaScript or Python), and/or of controlling and/or accessing data storage devices and/or other devices such as input interfaces and output interfaces. The term control computer also refers to a multiplicity of processors or a multiplicity of (sub)computers that are interconnected and/or connected and/or otherwise communicatively connected and possibly share one or more other resources, such as for example a memory.

A voltage between the conductors of the charging cable 5 preferably is monitored by the insulation monitor 3. If a voltage is applied here, this means that the contactor 4 is in the closed switching state and the correct connection of the insulation monitor 3 can be checked.

The charging cable 5 is connected to first connections 3.1 of the insulation monitor 3 or the insulation monitor 3 is connected at the first connections 3.1 to the charging cable 5. Electrical conductors and/or busbars between the contactor 4 and the power electronics system 7 are connected to second connections 3.2. The insulation monitor 3 monitors the electrical insulation of the electrical conductors and/or busbars between the contactor 4 and the power electronics system 7 via the second connections 3.2. Furthermore, the insulation monitor 3 checks the correct connection of the second connections 3.2 at the electrical conductors and/or busbars between the contactor 4 and the power electronics system 7. Both can be carried out in the closed and open switching state.

To ensure the correct performance of the charging process, the insulation monitor 3 compares the measurement values ascertained at the first connections 3.1 with the measurement values ascertained at the second connections 3.2 during the charging process. Discrepancies that imply possible problems and faults can thus be discovered and the charging process can be terminated in case of emergency.

LIST OF REFERENCE DESIGNATIONS

1 Charging device
2 Vehicle
3 Insulation monitor
3.1 First connections
3.2 Second connections
4 Contactor
5 Charging cable
6 Signal line
7 Power electronics system

What is claimed is:

1. A method for operating a vehicle-external charging device for charging an electric or hybrid vehicle, the charging device having a charging cable configured for connection to the electric or hybrid vehicle, a contactor, an insulation monitor connected between the contactor and the charging cable, and a power electronics system connected to the contactor so that the contactor is between the insulation monitor and the power electronics system, the method comprising: checking whether the contactor is in a closed switching state or an open switching state, checking an electrical connection of the insulation monitor when the contactor is in the closed switching state; using the insulation monitor to check an electrical insulation of the charging cable when the contactor is in an open switching state; and using the insulation monitor to check an electrical insulation of the charging device between the contactor and a power electronics system when the contactor is in the open switching state.

2. The method of claim 1, wherein a correct connection of the insulation monitor is checked by the insulation monitor.

3. The method of claim 1, wherein the switching state of the contactor is transmitted from a positively driven auxiliary contact of the contactor via a signal line to the insulation monitor.

4. The method of claim 1, wherein the switching state of the contactor is transmitted from a control computer of the charging device to the insulation monitor.

5. The method of claim 1, further comprising checking the electrical insulation of the charging cable at first connections of the insulation monitor, checking the electrical insulation of the charging device between the contactor and the power electronics system at second connections of the insulation monitor, and in the closed switching state of the contactor comparing measurement values at the first connections with measurement values at the second connections.

6. The method of claim 1, further comprising using the insulation monitor to monitor a voltage between electrical lines of the charging cable and to monitor a further voltage between electrical lines between the contactor and the power electronics system.

7. The method of claim 1, wherein the steps of checking the electrical connection of the insulation monitor and checking the electrical insulation of the charging cable are carried out based on reference values, wherein the reference values are provided to the insulation monitor as a value matrix and are updated in the event of a charging process.

* * * * *